United States Patent [19]
Chan et al.

[11] Patent Number: 5,693,178
[45] Date of Patent: Dec. 2, 1997

[54] ELECTRICAL TEST STRUCTURE TO QUANTIFY MICROLOADING AFTER PLASMA DRY ETCHING OF METAL FILM

[75] Inventors: Lap Chan, Astor Green; Simon Chooi, Singapore, both of Singapore

[73] Assignee: Chartered Semiconductor Manufacturing Pte Ltd., Singapore, Singapore

[21] Appl. No.: 559,050

[22] Filed: Jan. 18, 1996

[51] Int. Cl.$^6$ ............................................ H01L 21/00
[52] U.S. Cl. .......................... 156/627.1; 156/643.1; 216/61
[58] Field of Search ............................. 437/8; 156/626.1, 156/627.1, 643.1; 216/61, 86; 324/765, 766–769

[56] References Cited

U.S. PATENT DOCUMENTS

4,855,253  8/1989  Weber .............................. 437/8
5,326,428  7/1994  Farnworth et al. ............... 156/654

*Primary Examiner*—William Powell
*Attorney, Agent, or Firm*—George O. Saile; Stephen B. Ackerman

[57] ABSTRACT

A microloading quantification apparatus is comprising a supporting substrate, a first bonding pad deposited upon the supporting substrate, a second bonding pad deposited upon the supporting substrate, and an etched conductive pattern deposited upon the supporting substrate and operably connected to the first bonding pad and the second bonding pad. Methods for the formation and application of the microloading quantification apparatus to quantify the variation of the microloading effect as a result of modifications of the set of parameters of integrated circuit processing particularly those of the plasma dry etch are described.

15 Claims, 7 Drawing Sheets

ELECTRICAL TEST STRUCTURE TO QUANTIFY MICROLOADING AFTER PLASMA DRY ETCHING OF METAL FILM

BACKGROUND OF THE INVENTION

1. Field of the Invention

This invention relates to methods for the testing of semiconductor circuitry for the quantifying the effectiveness of semiconductor parametric control and to the construction and methods of application of testing apparatus for quantifying semiconductor process effectiveness particularly of plasma dry etching of metal film.

2. Description of Related Art

This invention grew out of the problems involving the tedious processing and material loss in the semiconductor process especially in the area of plasma dry etching of metal films.

Figure 1A:
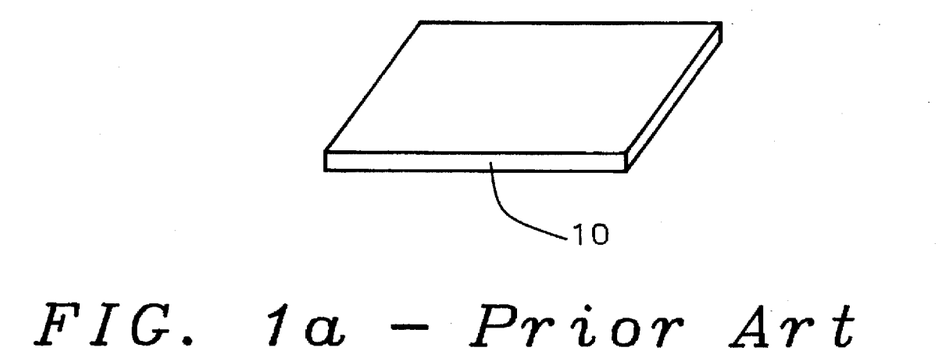
FIG. 1a–1g are cross-sectional views showing the prior art processing steps to deposit and etch conductive films on a substrate.
Figure 1B:
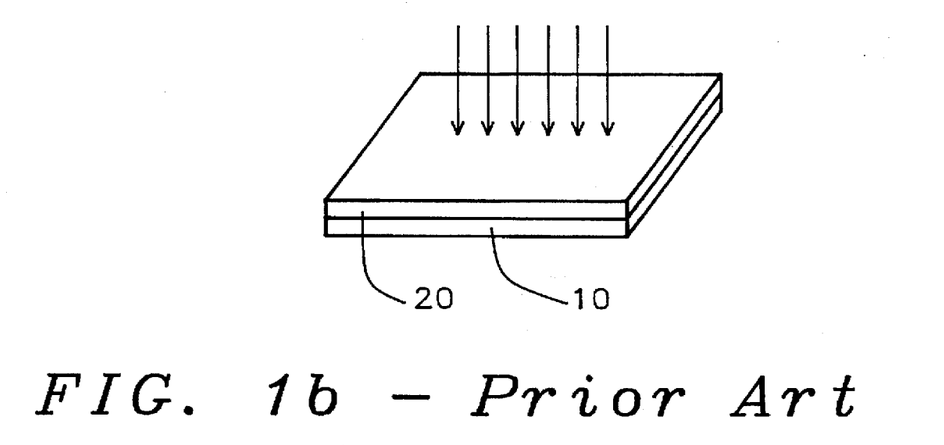
Figure 1C:
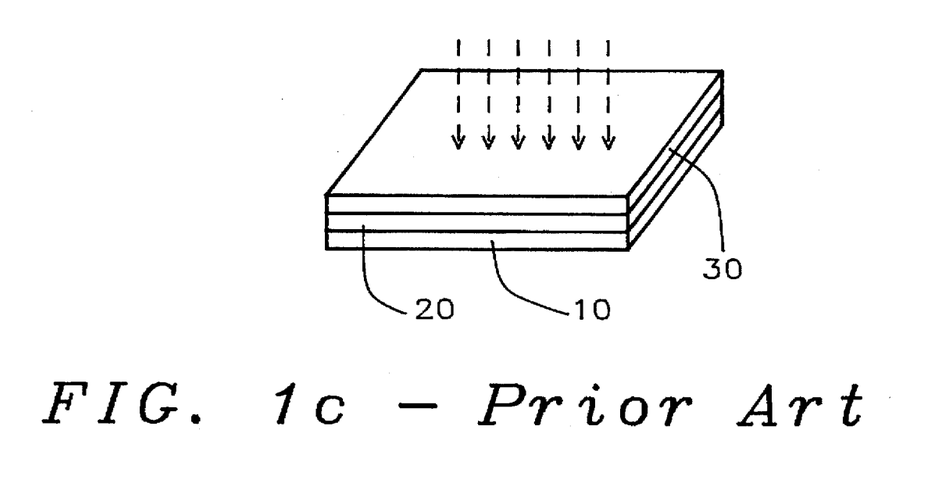
Figure 1D:
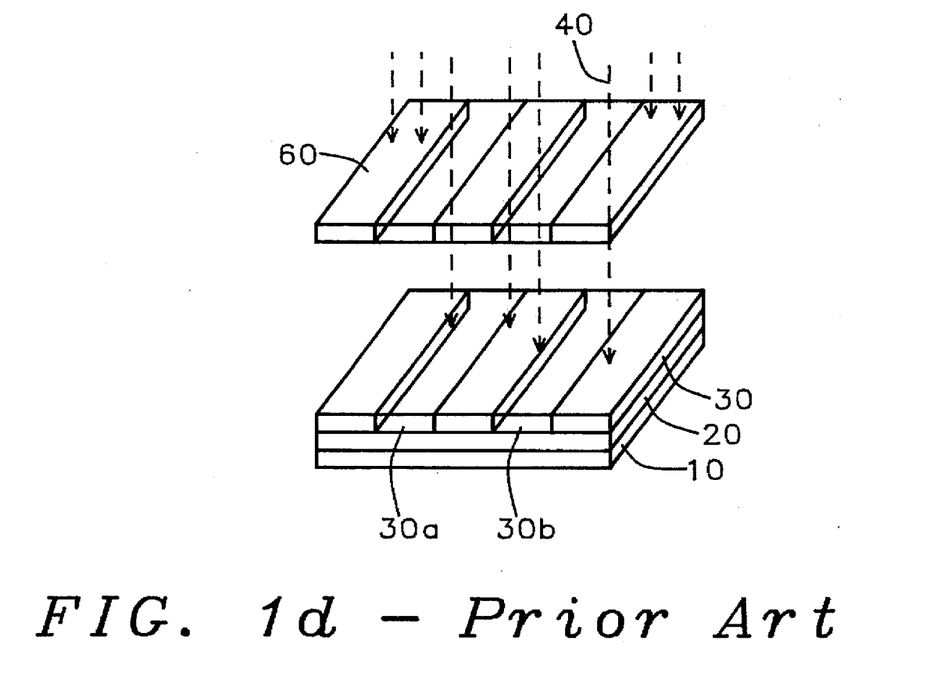
Figure 1E:
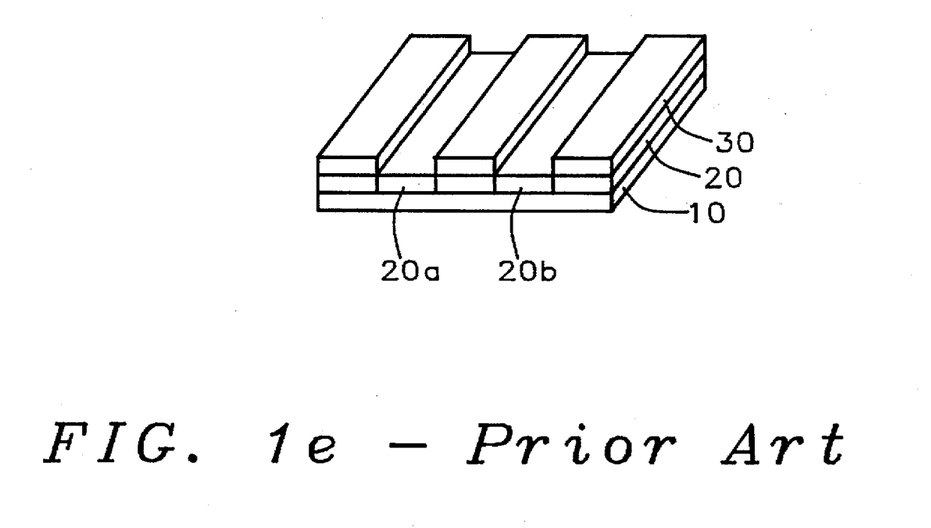
Figure 1F:
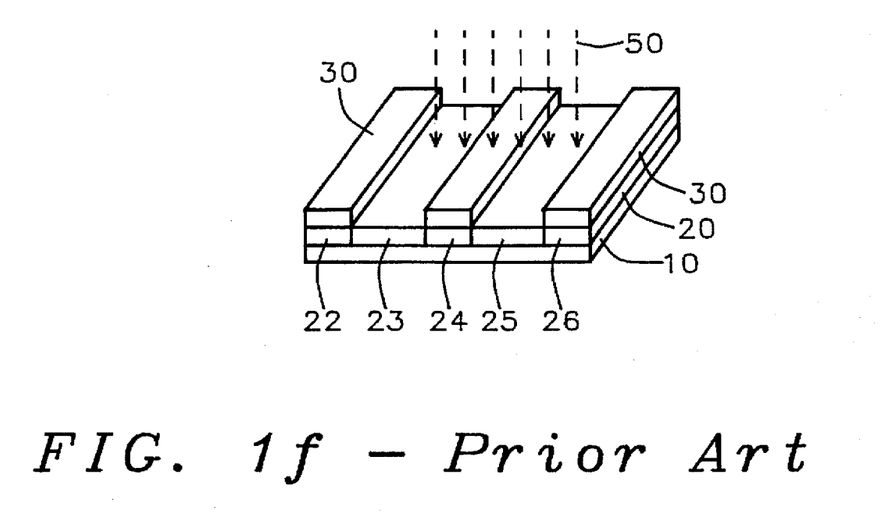

In the plasma dry etching process for metal film is shown in FIG. 1a, 1b . . . , 1g. In FIG. 1a a substrate 10 is shown. In FIG. 1b, a substrate 10 has a conductive metal 20 deposited on it by a physical or chemical vapor deposition process to a desire thickness. The substrate 10 is then coated with a material 30 that is resistant to the etchant is shown in FIG. 1c. FIG. 1d illustrates the etchant resistant material 60 covered with a masking material that will prevent exposure of certain areas of the material to a radiation source 40 such as visible light, infrared light, or X-ray radiation. The substrate 10 with the deposited metal film 20 and unprotected etchant resistant material 30 is exposed to the radiation source 40 and the unprotected etchant resistant material that is exposed to the radiation source 40 is cured in the areas not covered by the mask 30a, 30b. FIG. 1e shows the substrate 10 with the deposited metal film 20 and the exposed etchant resistant material 30 is then cleaned with a chemical that will remove the etchant resistant material 30 from the areas 20a, 20b of the metal film 20 that are to be removed from the substrate 10. FIG. 1f illustrates the substrate 10 with the deposited metal film 20 exposed to the plasma dry etch 50.

The factors that determine the effectiveness of the plasma dry etch 50 that are under the control of the operator are the Radio Frequency (RF) input power, reactor pressure, excitation frequency, temperature of the reactor, the temperature of wafer surface, the composition of the feed gas to the reactor, and the flow rate of the feed gas.

Figure 1G:
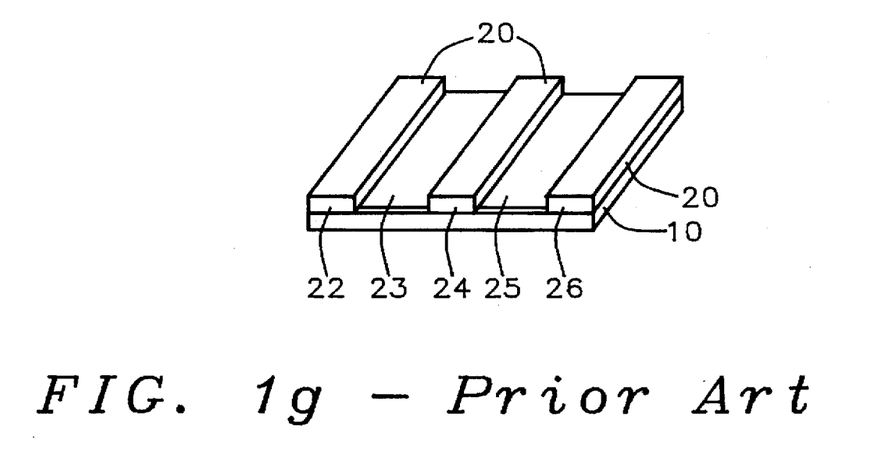

The areas 22, 24, 26 covered by the etchant resistant material 30 that none of the metal film is removed, while the areas 23, 25 exposed to the etchant 50 have the metal film removed. In FIG. 1g the etchant resistant material 30 and the areas 22, 24, 26 of the metal film 20 that were not exposed to the etchant have maintained their original thickness, whereas those areas 23, 25 exposed to the etchant 50 have their thickness significantly reduced. The ratio of the thickness of the metal film 20 in the areas 23, 25 of the metal film 20 that were exposed to the metal film to the thickness of the areas 22, 24, 26 of the metal film 20 that were not exposed to the etchant 50 is defined as the microloading $\Psi$.

The quantification of the effectiveness of the etchant 50 was accomplished by a cross sectional cut through the substrate and examining the edge of the exposed substrate 20 with a scanning electron microscope. In order to evaluate the effect of changes in the set of parameters that determine the etchant, this process had to repeated many times with subsequent loss of the substrates and expenditure of time.

Apparatus and methods such as disclosed in U.S. Pat. No. 5,326,428 (issued Jul. 5, 1994 to Farnsworth et al. for Method For Testing Semiconductor Circuitry For Operablity and Method For Forming Apparatus For Testing Semiconductor Circuitry For Operablity) use unique patterns on a substrate to allow testing for operability of the semiconductor circuitry as opposed to an ability to evaluate process parameters of the fabrication of the semiconductor circuitry.

SUMMARY OF THE INVENTION

An object of this invention is to minimize the tedium and material loss from the traditional techniques used for the quantification of the microloading from prior art. This object is achieved by the creation of the microloading quantification apparatus that comprises a supporting substrate on which two bond pads and etched conductive patterns are deposited. The two bond pads are operably connected to the etched conductive pattern at opposite ends.

Another object of this invention is to provide a method for the application of the microloading quantification apparatus. This object is achieved by operably coupling to the bond pads a constant current source and a voltage measuring means. The next step is measuring of the voltage developed between the bond pads as a result of the current being forced through the microloading quantification apparatus by the constant current source. The next step is determining the resistance of the microloading quantification apparatus. The next step is calculating of the microloading for the microloading quantification apparatus, The aforementioned steps are repeated on a plurality of microloading quantification apparatus that have been processed with variations in the processing parameters of the semiconductor process. The final step is comparing of the variations in processing parameters of the semiconductor process with the values of the microloading.

DETAILED DESCRIPTION OF THE INVENTION

In the development of the process parameters of the plasma dry etch, a method and apparatus needed to be provided that would eliminate the tedium and material loss associated with the cross sectional slicing and evaluation of the microloading with a scanning electron microscope. To accomplish this goal, the invention uses the measurement of the resistance of a structural block fabricated by the deposition of a uniform thickness of a metal film upon a substrate and the etching of a plurality of rectangular areas from the structural block. The resistance of the structural block is directly related to the value of the cross sectional area of the surface orthogonal to the direction of a current flow and the length of the structural block parallel to the direction of the current flow.

Figure 2:
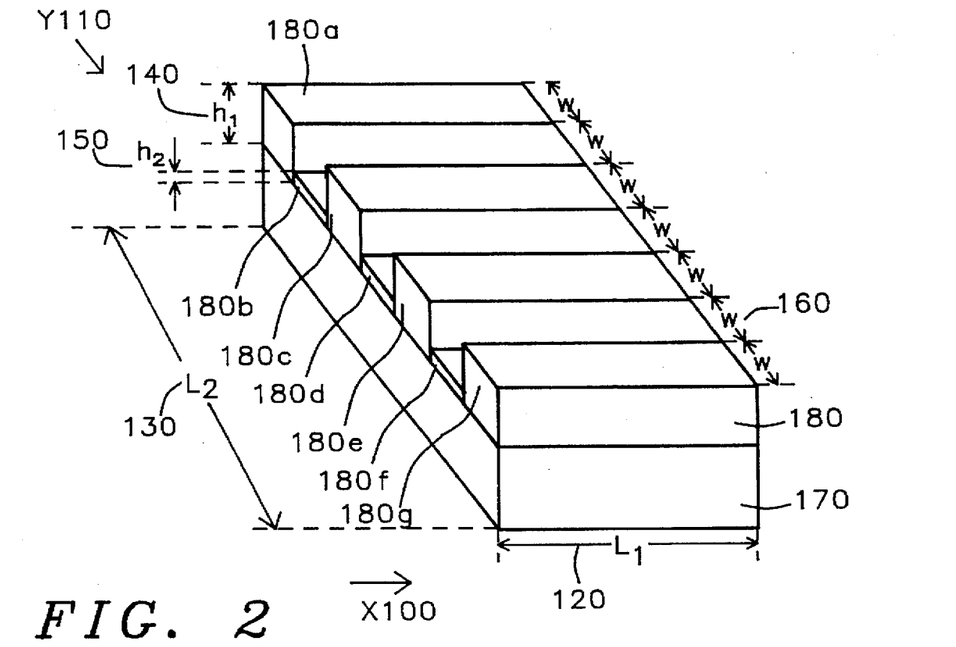
FIG. 2 is a cross-sectional view of the preferred embodiment of this invention describing the geometric parameters considered.

In FIG. 2 the structural block 180 is the metal film deposited upon the substrate 170. After the etching process, the structural block 180 is divided into a plurality of rows 180a, 180b, ..., 180g, wherein the rows exposed to the etchant 180b, 180d, 180f have a height $h_2$ 150 that is less than the height $h_1$ 140 of the rows not exposed to the etchant 180a, 180c, 180e, 180g. The microloading $\Psi$ of the structural block of metal film 180 is the ratio $$\Psi = h_2/h_1$$

The structural block 180 further has a dimension in the X 100 direction that is $L_1$ 120 and a dimension in the Y 110 direction that is $L_2$ 130. Each row has a width dimension in the Y 110 direction that is w 160. In order to facilitate the calculation of the microloading all of the widths w 160 should be equal to every other and the number of rows should be $$L_2/w.$$

The structural block 180 also has a physical property, sheet resistivity r, that is defined as the quotient of the magnitude of a voltage developed across a unit area of a material of uniform thickness divided by the magnitude of a current flowing through the unit area.

The conductance C of the structural block 180 will then be:

$$C = \sum_{i=1}^{N} \Delta wi/rL_i$$

where $\Delta Wi$ is the width of an arbitrary subdivision of the dimension of the structural block that in the direction orthogonal to the direction of a current flow r is the sheet resistivity of the material of the structural block $L_i$ is the dimension of the structural block 180 that is parallel to the direction of the current flow at the $\Delta wi$.

N is the total number of subdivision of the length L i is the counting variable of the subdivisions of the length L.

In FIG. 2 if the current is forced into the structural block 180 along the X 100 direction, then the width of the structural block is in the Y 110 dimension and can be subdivided into the units that are the width w 160 of each row. The length for the calculation is the dimension $L_1$ and the sheet resistivity for the unetched blocks $r_{ue}$. The conductivity of an unetched row $C_{ue}$ is $$C_{ue} = w/r_{ue}L_1$$

Since the height of the etched segments $h_2$ is proportional to the unetched height $h_1$ by the factor $\Psi$ the sheet resistivity $r_e$ of the etched segment is then $$r_e = \frac{r_{ue}}{\Psi}$$

From this ratio the conductivity $C_e$ of the etched rows is $$c_e = w\Psi/r_{ue}L_1$$

If the number of rows of the structural block 180 is odd number with an unetched row as the first 180a and last row 180g, then the number of unetched rows $N_{ue}$ can be determined by $$N_{ue} = (L_2/w + 1)1/2.$$

The number of etched rows $N_e$ can be determined by $$N_e = (L_2/w + 1)1/2 - 1 = 1/2(L_2/w - 1)$$

The total conductance $C_B$ of the structural block 180 is then determined by $$C_B = N_{ue}C_{ue} + N_e C_e$$

$$C_B = \tfrac{1}{2}(L_2/w + 1) \, w/r_{ue}L_1 + \tfrac{1}{2}(L_2/w - 1)\Psi \, w/r_{ue}L_1$$

The resistance $R_B$ of the structural block is $$R_B = 1/C_B$$

The measurement of the resistance of the structural block 180 is accomplished by the measurement of the voltage V developed across the structural block 180 as a result of a current I being forced through it. From Ohm's Law, the resistance is $$R_B = V/I$$

Once the resistance $R_B$ of the structural block 180 is determined the quantification of the microloading $\Psi$ is calculated from the function for the conductivity $C_B$ by solving for the microloading. This is $$\Psi = \frac{2r_{ue}L_1}{R_B(L_2 - w)} - \frac{L_2 + w}{L_2 - w}$$

Figure 3:
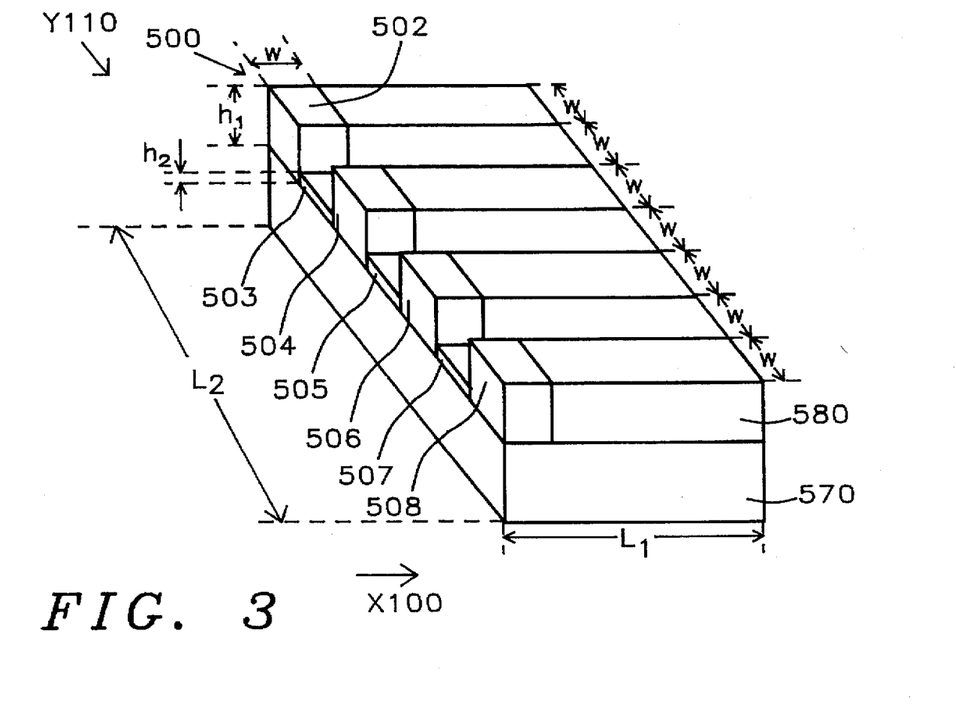
FIG. 3 is a cross-sectional view of an alternate structure for the preferred embodiment in which the geometric parameters are described.

FIG. 3 illustrates the case 2 of a current being forced in the Y 110 direction to calculate the conductance of the structural block 580, the $\Delta w_i$ is in the X 100 direction and is assumed to be equal to w and the number of rows is $$L_1/w.$$

Since each row 500 now consists of etched and unetched segments, the resistance $R_r$ of the row 500 is now $$R_r = \sum_{j=1}^{M} r\Delta L_j/w_i$$

where $w_i$ is the assumed width of the row # r is the sheet resistivity of the metal film $\Delta L_j$ is the length of the subdivision in the X 100 direction M is the number of subdivisions in the length of the structural block 30 $L_1$ j is the counting variable of the subdivisions of the length variable $L_1$ The resistance $R_{ue}$ for a unetched segments 502, 504, 506, 508 becomes $$R_{ue} = r_{ue}w/w = r_{ue}$$

and the resistance $R_e$ for an etched segments 503, 505, 507 becomes $$R_e = r_{ue}w/\Psi w = r_{ue}/\Psi$$

The total number of segments in the row 500 is $$L_2/w.$$

If the number of segments in the row 500 is an odd number and if the first 502 and the last 508 segments are unetched then the number of unetched segments $N_{ue}$ is $$N_{ue} = (L_2/w + 1)1/2$$

and the number of etched segments $N_e$ is $$N_e = (L_2/w - 1)1/2$$

The total resistance $R_{row}$ is $$R_{row} = N_{ue} R_{ue} + N_e R_e$$

$$R_{row} = r_{ue}(L_2/w + 1)1/2 + r_{ue}/\Psi(L_2/w - 1)1/2$$

$$R_{row} = r_{ue}/2[(L_2/w + 1) + 1/\Psi(L_2/w - 1)]$$

The resistance $R_b$ of the structural block 580 then becomes $$R_b = R_{row}/N_{rows}$$

where $N_{rows} = L_1/w$ $$R_b = \frac{r_{ue}/2[(L_2/w + 1) + 1/\Psi(L_2/w - 1)]}{L_1/w}$$

Again using the aforementioned technique to physically determine the resistance of the structural block 580, the microloading $\Psi$ can be calculated as $$\Psi = \frac{r_{ue}(L_2 - w)}{2R_bL_1 - L_2r_{ue} - r_{ue}w}$$

Figure 4:
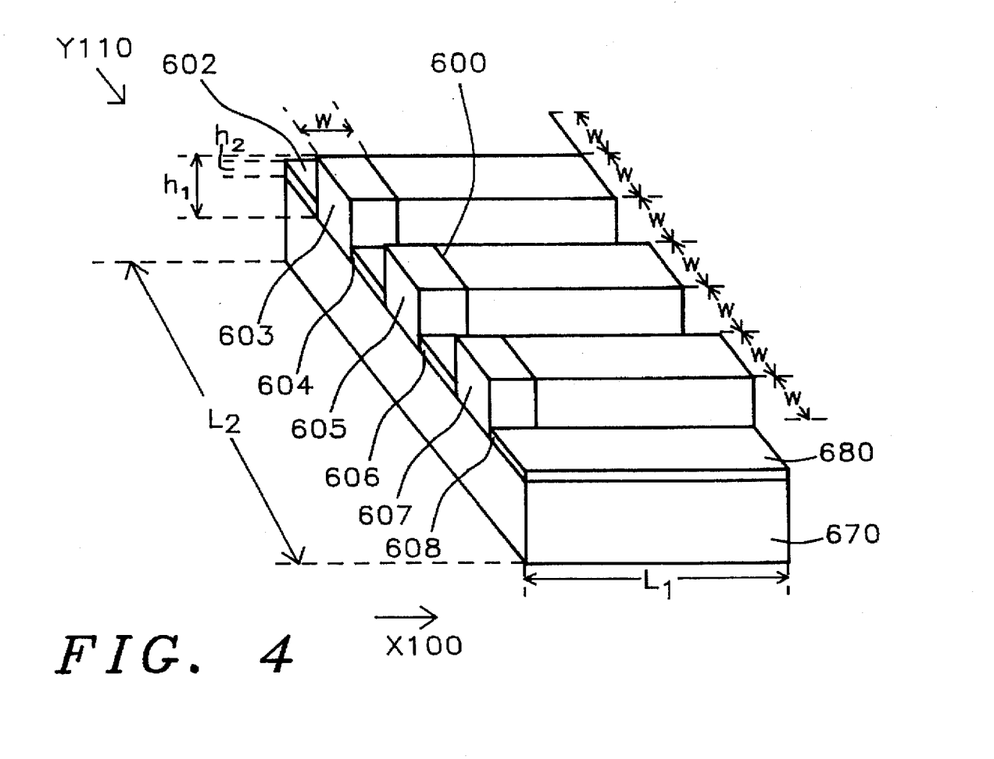
FIG. 4 is a cross-sectional view of another alternate structure for the preferred embodiment, in which the geometric parameters are considered.

FIG. 4 illustrates Case 2 wherein the first 601 and last 605 segment of the row 600 of segments is etched, then the number of etched segments $N_e$ is $$N_e = (L_2/w + 1)1/2.$$

and the number of unetched segments $N_{ue}$ is $$N_{ue} = (L_2/w - 1)1/2.$$

The resistance $R_{row}$ of the row 600 of etched 601, 603, 605 and unetched 602, 604, 606 segments is now $$R_{row} = r_{ue}/2[(L_2/w - 1) + 1/\Psi(L_2/w + 1)]$$

and the total resistance $R_b$ of the structural block 680 is $$R_b = \frac{r_{ue}/2[(L_2/w - 1) + 1/\Psi(L_2/w + 1)]}{L_1/w}$$

The microloading $\Psi$ for this form of case 2 then becomes $$\Psi = \frac{r_{ue}(L_2 + w)}{2R_bL_1 - L_2r_{ue} + r_{ue}w}$$

Figure 5:
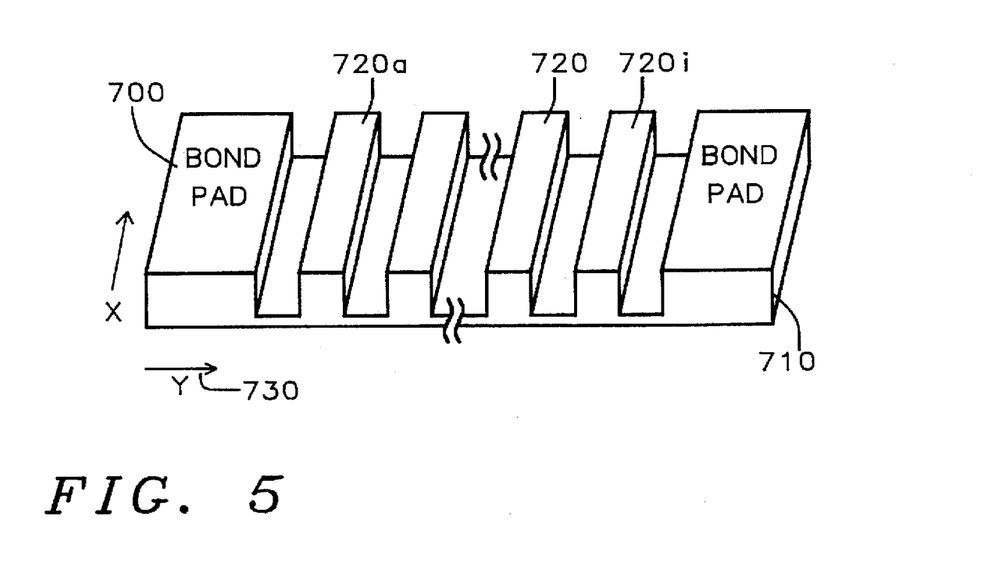
FIG. 5 is an cross-sectional of an implementation of the preferred embodiment, in which the structure of FIG. 4 is implemented.

FIG. 5 illustrates an implementation of the preferred embodiment of this invention. The first bond pad 700 is operably connected to the first row 720a of the structural block 720 and the second bond pad 710 is operably connected to the last 720i row of the structural block 720. A constant current source and a voltage measuring means (not shown) is operably coupled between the first and second bond pads 700, 710 and the resistance is determined. The microloading is then calculated using the function $$\Psi = \frac{r_{ue}(L_2 + w)}{2R_bL_1 - L_2r_{ue} + r_{ue}w}.$$

Figure 6:
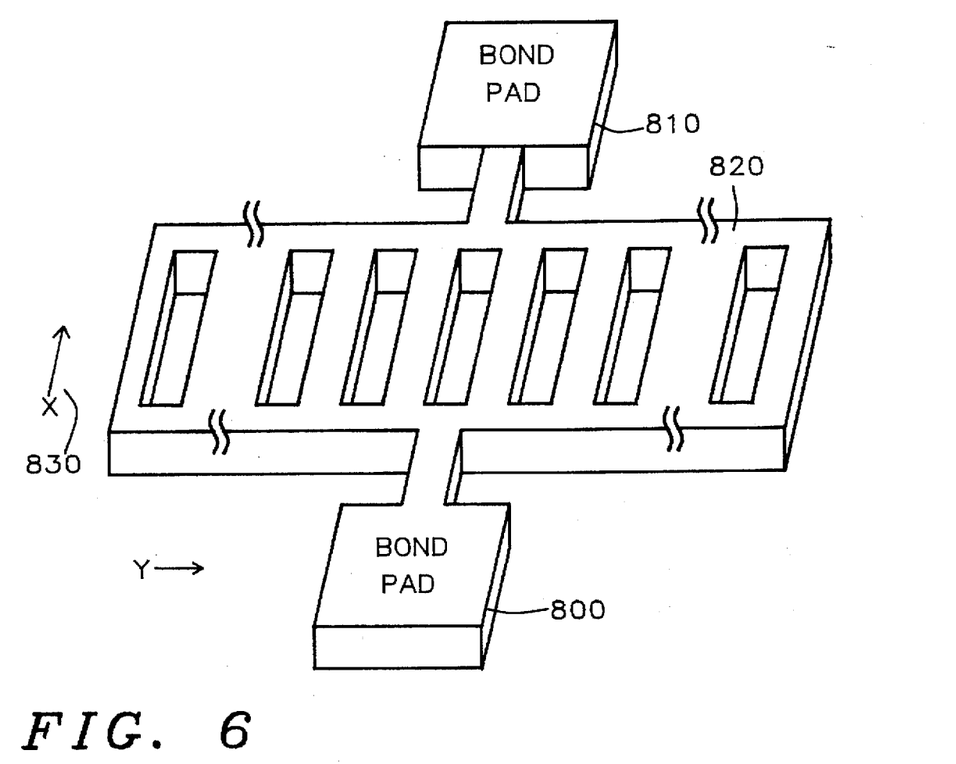
FIG. 6 is an illustration of another implementation of the preferred embodiment, in which the structure of FIG. 2 is implemented.

FIG. 6 illustrates another implementation of the preferred embodiment wherein the current from the current source (not shown) that is operably coupled to first and second bond pads 800, 810 is forced through the structural block 820 in the X 830 direction. The voltage is measured by a voltage measuring means (not shown) that is operably coupled between the first and second bonding pads 800, 810 and the resistance is determined. The microloading $\Psi$ is calculated by the function $$\Psi = \frac{2r_{ue}L_1}{R_B(L_2 - w)} - \frac{L_2 + w}{L_2 - w}$$

Figure 7:
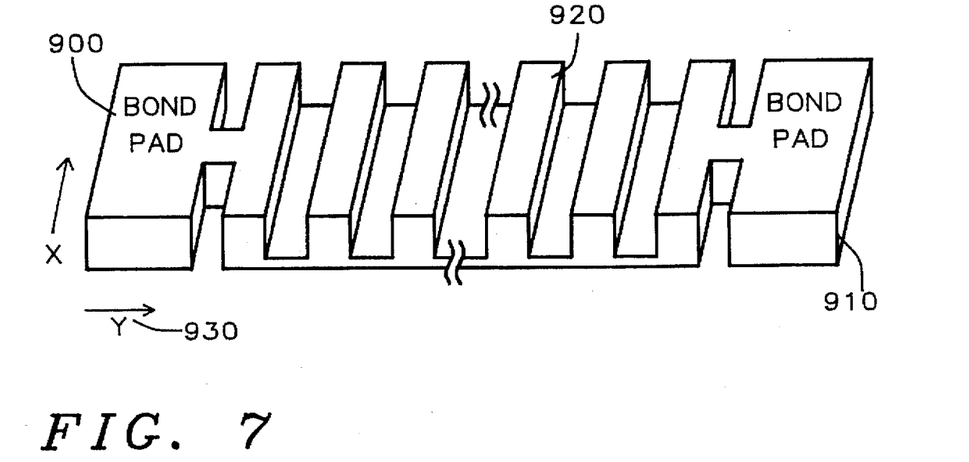
FIG. 7 is an illustration of still another implementation of the preferred embodiment in which the structure of FIG. 3 is implemented.

FIG. 7 illustrates another implementation of the preferred embodiment wherein the current from the current source (not shown) is operably coupled between the first and second bond pads 900 910 is forced through the structural block 920 in the Y 930 direction. The voltage measured by the voltage measuring means (not shown) operably coupled between the first and second bond pads 900 910 and the resistance of the structural block 920 is determined. The microloading is calculated using the function $$\Psi = \frac{r_{ue}(L_2 - w)}{2R_bL_1 - L_2r_{ue} - r_{ue}w}.$$

Figure 8:
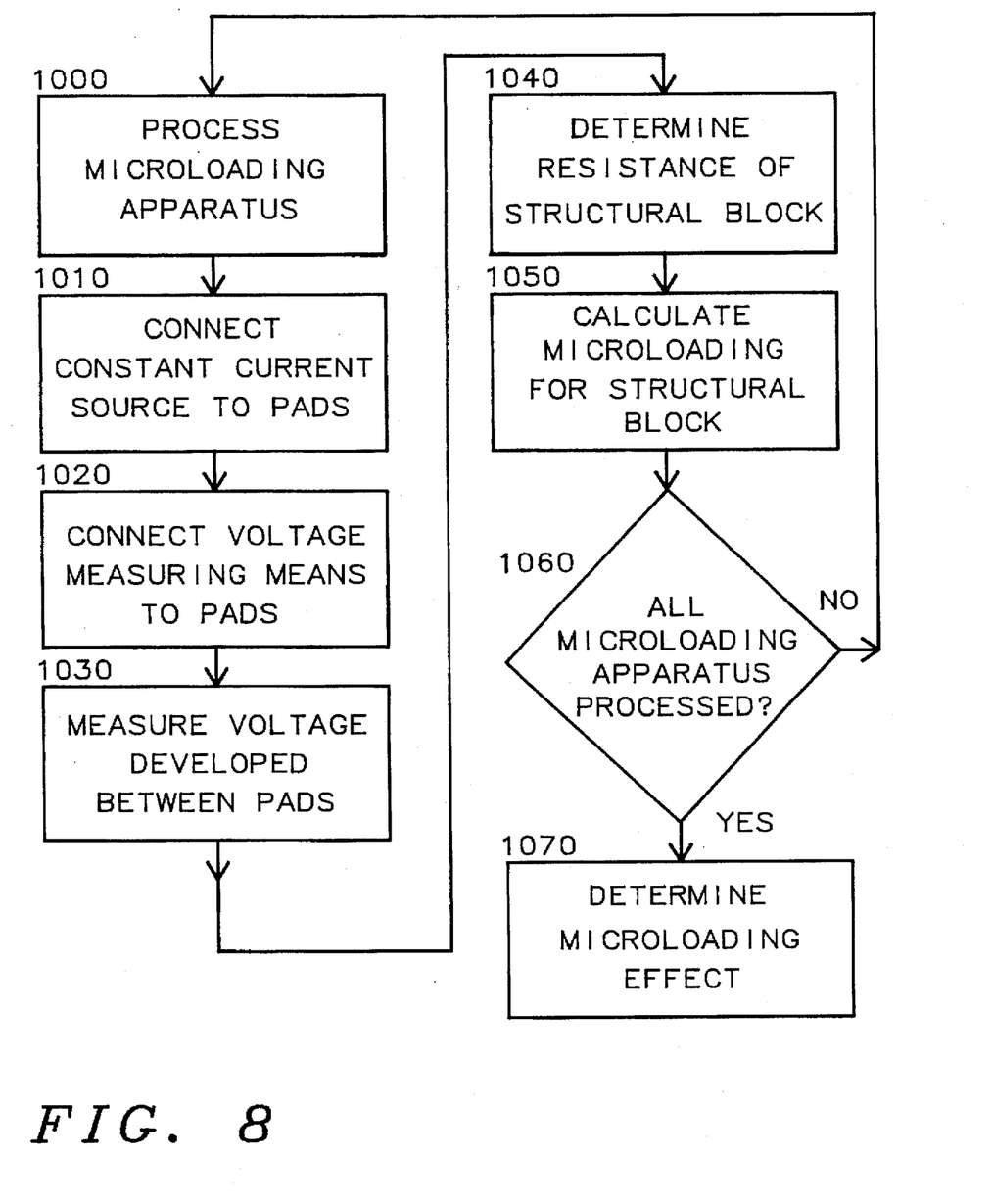
FIG. 8 is a diagram of the process of using the microloading quantification apparatus.

The method for the application of the microloading quantification apparatus is outlined in FIG. 8. The first step 1000 is the processing of the microloading quantification apparatus using known semiconductor process techniques including plasma dry etch. The second step 1010 is the operably coupling of a constant current source between the bonding pads of the microloading quantification apparatus. The third step 1020 is the operably coupling of a voltage measuring means between the bonding pads of the microloading quantification apparatus. The fourth step 1030 is the measuring of the voltage developed between the bonding pads of the microloading quantification apparatus from the current being forced through the bonding pads of the microloading quantification apparatus. The fifth step 1040 is the determining of the resistance of the microloading quantification apparatus. The sixth step 1050 is the calculation of the microloading effect using the function for the type of microloading quantification apparatus being tested. The seventh 1060 is the repeating of the first six steps for multiple microloading quantification apparatus while adjusting the parameters of the semiconductor process especially those for the plasma dry etch.

Once all of the microloading quantification apparatus have been process and the microloading calculated, the final step 1070 is the comparing of the variation of the microloading effect for the variation of the parameters of the semiconductor process.

While the invention has been particularly shown and described with reference to the preferred embodiments thereof, it will be understood by those skilled in the are that changes in form, materials, and details may be made without departing from the spirit and scope of the invention.

What is claimed:

1. A method of formation of a microloading quantification apparatus comprising the steps of:
   a) providing a supporting substrate
   b) depositing a conductive material film upon the supporting substrate;
   c) depositing a photoresistive material upon the conductive material film;
   d) exposing the photoresistive material to a radiation source such as visible light, infrared radiation, or X-rays through a photomasking means to define the geometric outlines of a first bonding pad, a second bonding pad, and a plurality of etched conductive patterns, and to cure the photoresistive material;
   e) removing the photoresistive material from the conductive material film for the areas not defined by the first bonding pad, the second bonding pad and the plurality of etched conductive patterns;
   f) exposing the conductive material film to the plasma dry etch to remove a portion up to the entire conductive material film that is not concealed by the photoresistive material; and
   g) removing the photoresistive material that concealed the conductive material defining the first bonding pad, the second bonding pad, and the etched conductive patterns.

2. A method for the application of a microloading quantification apparatus comprising the steps of:
   a) providing said microloaing apparatus comprising a first bonding pad, a second bonding pad, and a plurality of conductive patterns;
   b) operably coupling a constant current source between the first bonding pad and the second bonding pad;
   c) operably coupling a voltage measuring means between the first bonding pad and the second bonding pad;
   d) measuring a voltage that is developed by the constant current source passing a current through the plurality of conductive patterns;
   e) determining a resistance of the plurality of etched conductive patterns; and
   f) repeating the operable coupling of the first bonding pad and second bonding pads to the current source and the voltage measuring means, the measuring the voltage developed across the plurality of conductive patterns, and determining the resistance for a multiplicity of microloading quantification apparatuses.

3. The method of claim 2 wherein each microloading quantification apparatus are formed by the variation of a set of parameters of the plasma dry etch.

4. The method of claim 2 wherein the resistance of the plurality of etched conductive pattern is defined by the quotient of the voltage developed between the first bonding pad and the second bonding pad divided by the value of the current being forced through the plurality of conductive pattern by the constant current source.

5. The method of claim 2 where in the resistance of the etched conductive patterns is determined by the set of parameters of the plasma dry etch step.

6. The method of claim 2 further comprising the step of determining the correlation of the variation of the resistance to the change of the set of parameters of the plasma dry etch.

7. A microloading quantification apparatus to determine a microloading factor, wherein said microloading factor is a measure of etching of a conductor during a plasma dry etch, comprising:
   a) a supporting substrate;
   b) a first contact bonding pad deposited on the supporting substrate;
   c) a second contact bonding pad deposited on the supporting substrate; and
   d) a etched conductor pattern deposited on the supporting substrate and operably connected to the first bonding pad and the second bonding pad, wherein the etch conductor pattern comprises;
      a first geometric area with a first uniform thickness of a conductive material not removed during the plasma dry etch, and
      a second geometric area with a second uniform thickness of conductive material, wherein the second geometric area with a second uniform thickness of conductive material is determined by the set of parameters of the plasma dry etch,
   such that the first thickness is proportional to the second thickness and this ratio is defined as the microloading.

8. The microloading quantification apparatus of claim 7 further comprising:
   a) a current source operably coupled between the first contact bonding pad and the second contact bonding pad to force a current flow through said etched conductor pattern; and
   b) a voltage measurement device operably coupled between the first contact bonding pad and the second contact bonding pad in parallel with said current source to determine a voltage developed across said etched conductor pattern and thereby a determine a resistance of said etched conductor pattern.

9. A microloading quantification apparatus of claim 7 wherein the etched conductor pattern further comprises:
   a) a cross-sectional area determined by the function $$\sum_{i=1}^{X} t_i \Delta x_i$$

where
   X is the dimension of the conductor pattern orthogonal to the direction of the current flow from the current source and orthogonal to the thickness of the conductive material
   $\Delta x_i$ is an arbitrarily small subdivision of the X dimension
   i is the counting variable for the subdivisions $\Delta x_i$
   $t_i$ is the thickness of the conductive material at each $\Delta x_i$; and
   b) a length that is the dimension of the conductive material parallel to the direction of the current flow from the current source and orthogonal to the X dimension and to the thickness.

10. The microloading quantification apparatus of claim 7 wherein the resistance of the etched conductor pattern and the first and second geometric areas determine the microloading.

11. A method for the application of a microloading quantification apparatus comprising the steps of:
   a) providing said microloading quantification apparatus, comprising a first contact bonding pad, a second contact bonding pad, and etched conductor patterns;
   b) operably coupling a constant current source between the first contact bonding pad and second contact bonding pad;
   c) operably coupling a voltage measuring means between a first contact bonding pad and a second contact bonding pad;

d) measuring of a voltage that is created by the current flow from the constant current source passing through the etched conductor patterns;

e) determining the measured resistance of an etched conductor pattern;

f) comparing the determined resistance of the etched conductor pattern with an expected resistance of the etched conductor pattern;

g) determining a microloading variation of the etched conductor pattern; and h) repeating the aforementioned steps for a multiplicity of microloading quantification apparatuses.

12. The method of claim 11 wherein each microloading quantification apparatus of the multiplicity of microloading quantification apparatuses are formed by the variation of a set of parameters of the plasma dry etch step of the integrated circuits process.

13. The method of claim 11 wherein the resistance of the plurality of etched conductor pattern is defined by the quotient of the voltage developed between the first bonding pad and the second bonding pad divided by the value of the current being forced through the plurality of conductive pattern by the constant current source.

14. The method of claim 12 wherein the expected resistance of the etched conductor pattern is determined by the function $$\sum_{j=1}^{M} \frac{r \Delta L_j}{w_j}$$

where r is the sheet resistivity of the conductive material $L_j$ is the dimension of the conductive material parallel to the flow of the current from the current source $\Delta L_j$ is an arbitrary subdivision of the length of the conductive material $w_j$ is the width of the conductive material at the subdivision of the length $L_j$ and the dimension of the conductive material orthogonal to the flow of the current from the current source j is the counting variable for the each of the subdivisions of $L_j$ M is the total number of subdivisions of the length $L_j$.

15. The method of claim 11 wherein the microloading variation is the ratio of the calculated resistance to the expected resistance.

* * * * *